(12) United States Patent
Fletcher et al.

(10) Patent No.: US 6,222,332 B1
(45) Date of Patent: Apr. 24, 2001

(54) LOW COST HIGH PERFORMANCE SINGLE BOARD MOTOR CONTROLLER

(75) Inventors: Mitchell S. Fletcher; Paul T. Marshall; Walter K. White; Ralph J. Franke; Mark A. Villela, all of Glendale, AZ (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 09/397,679

(22) Filed: Sep. 16, 1999

(51) Int. Cl.⁷ ............... H02K 23/00; H02P 1/18; H02P 3/08; H02P 5/06; H02P 7/06
(52) U.S. Cl. .................. 318/254; 318/138; 318/439; 318/721; 318/722
(58) Field of Search ........................ 318/254, 138, 318/439, 801, 721, 722, 599, 628, 610, 618

(56) References Cited

U.S. PATENT DOCUMENTS

| | | | |
|---|---|---|---|
| 4,779,031 | * 10/1988 | Arends et al. | 318/565 |
| 5,420,492 | * 5/1995 | Sood et al. | 318/809 |
| 5,465,011 | * 11/1995 | Miller et al. | 307/64 |
| 5,483,436 | * 1/1996 | Brown et al. | 363/98 |
| 5,619,114 | * 4/1997 | Blasko | 318/812 |
| 5,850,132 | * 12/1998 | Garces | 318/599 |
| 5,869,946 | * 2/1999 | Carobolante | 318/811 |
| 5,905,644 | * 5/1999 | Blasko et al. | 363/41 |
| 6,040,673 | * 3/2000 | Isomura et al. | 318/615 |

OTHER PUBLICATIONS

Paper entitled ?A New family Of Low Cost Momentum/Reaction Wheels by Bill Bialke for 1992 American Astronatical Sociaty Paper.

* cited by examiner

Primary Examiner—Robert E. Nappi
Assistant Examiner—Edgardo San Martin
(74) Attorney, Agent, or Firm—Charles J. Ungiemach; Robert E. Greenstien

(57) ABSTRACT

A motor controller circuit including an energy storage device, a bus protection circuit, an input signal selector, a combiner, a compensator, a modulator, a motor driver circuit, a commutator, a feedback circuitry and a plurality of filters, resistors, inductances, capacitances and optical isolators all contained on a single circuit board for use in controlling a motor with a minimum of cost and space requirements.

15 Claims, 3 Drawing Sheets

LOW COST HIGH PERFORMANCE SINGLE BOARD MOTOR CONTROLLER

BACKGROUND OF THE INVENTION

1. Field of the Invention

The present invention relates to motor control circuitry and architecture and more particularly to a low cost, high performance, high volume production single board motor controller for use for use with reaction wheel assemblies (RWAs), control moment gyroscopes (CMGs) and pointing systems, on space vehicles where size and weight play an important roles.

2. Description of the Prior Art

Honeywell presently produces a motor control system identified as the HR0610 which has met design requirements for advanced systems such as the Global series of RWAs however, with changing satellite markets, there is an ever increasing requirement for minimal cost, minimal size and high volume production without compromising quality or performance. Because of the size limitations imposed by the RWAs, the HR0610 presently requires two printed circuit boards and a plurality of electronic components of considerable size.

BRIEF DESCRIPTION OF THE INVENTION

The present invention draws upon the high quality and performance of the HR0610 bit includes a number of design modifications which reduce the size and weight of the controller to where it may occupy a single printed circuit board and still fit the size limitation of the RWAs. Production is also improved and cost is reduced. An example of one of the innovations is accomplished by analyzing the electronic filters heretofore composed of an three inductors and two capacitors, and determining that by utilizing four inductors and three capacitors the overall size of the filter can actually be reduced without changing its filtering ability. Utilization of hybrid circuits further reduces size and cost with the result that a vastly improved RWA implementation (called the HR14) is produced with only about 70% of the previous electronics size and weight and this is accomplished with a 40% reduction in cost.

DETAILED DESCRIPTION OF THE PREFERRED EMBODIMENTS

Figure 1:
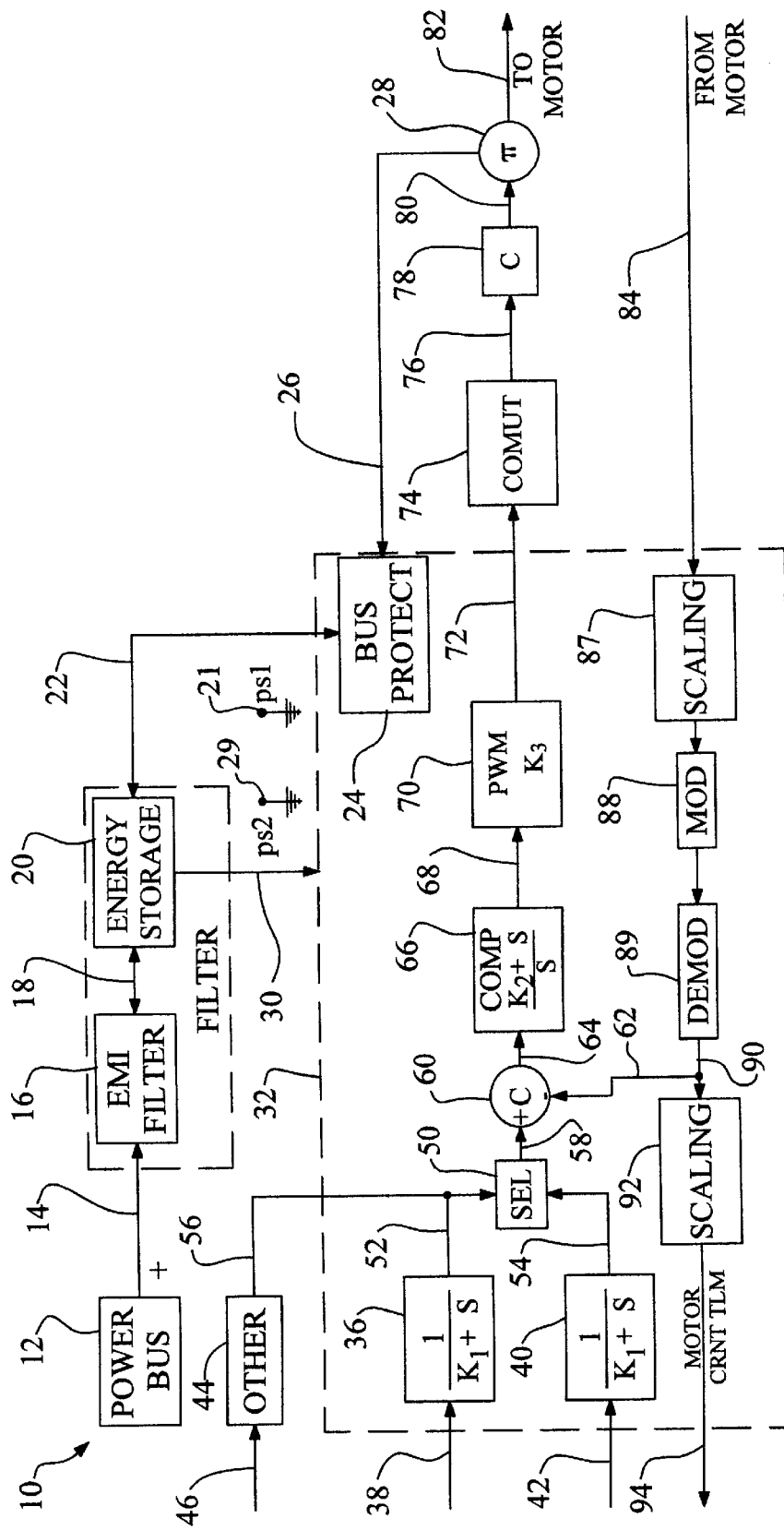
FIG. 1 shows a block diagram of the control functions of the motor controller.

Referring to FIG. 1, the block diagram for the control functions of a motor control circuit 10 is shown. A power bus 12 supplies a positive DC voltage and current on a line 14 to an electromagnetic interference filter 16 which filters out unwanted components such as noise. The filtered voltage is presented over a line 18 to an energy storage device 20. Energy storage device 20 supplies a first DC power source, ps1 having a first ground connection 21, over a line 22 and operates to provide power for the motor (not shown) through a bus protection circuit 24 and a line 26 to a multiplier 28. Because power is generated from the motor when commanding a slow down of the rotating element (detorque), the lines 14, 18, 22 and 26 are shown as double ended arrows to show that signals pass in both directions. The bus protection circuit operates to protect the internal circuits from damage that may be caused by improper operation by the user or system level faults. Energy storage 20 is also used to produce a second DC power source, ps2, having a second ground connection 29, over a line 30 which operates to provide power to the components of a control circuit made up of a gate array and hybrid circuit 32, to be described. The two ground references 21 and 29 operate to provide electrical isolation between the control circuit 32 and the motor.

Custom hybrid circuit 32 constitutes an RWA control with an innovative arrangement of control components that reduces the size and cost of the previous arrangement by a design which allows ease of reconfiguration between various user requirements such as torque scale It is known that microelectronics design based upon hybrid implementation requires far fewer parts than a discrete design.

A first desired torque signal is presented to a first input filter 36 in hybrid circuit 32 on a line 38. A second desired torque signal may be presented to a second input filter 40 in hybrid circuit 32 on a line 42. Other torque input command signals, which may be digital, may also be supplied via a shift register and pulse DAC, shown as box 44, on a line 46. After filtering, these desired command torque signals are presented to a selector 50 by way of lines 52, 54 and 56 respectively. Selector 50 operates to select one of the desired filtered torque command signals and present it via line 58 to a combiner 60. Combiner 60 also has a feedback input on a line 62 which contains the wanted output from the motor and unwanted errors and noise from the system. Combiner 60 operates to combine the inputs on lines 58 and 62 and to present the combined signal via a line 64 to a compensator 66. Compensator 66 operates to nullify the error signals on line 64 by producing an appropriate signal which is presented to a pulse width modulator 70. Pulse width modulator 70 operates to change the command signal so as to produce an average command on a line 72. The average command signal is used to control the motor at a reduced voltage without the power dissipation encountered by such devices as a linear amplifier. The average command signal on line 72 is presented to a commutator 74 which operates to provide a motor drive signal on a line 76 which is characterized for presentation to the proper winding of the motor. Since the motor and its associated components are supplied with power on line 22 which has a reference ground 21 of the power source ps1, and since the components in hybrid circuit 32 are supplier with power on line 30 which has a reference ground 29 of power source ps2, the converter 78 is used to receive the proper winding signal on line 76 and to convert the signal from one having the reference ground 29 to one having the reference ground 21. The signal from converter 78 is presented to the multiplier 28 via line 80 to provide the final motor drive signal on line 82. Line 84 is shown leading from the motor back to the hybrid circuit 32. This feedback signal passes through a converter 86, comprising a scaling circuit 87, a modulator 38 and a demodulator 89, which together operate to change the signal on line 84 which is referenced to ground 21 to the feedback signal on line 62 which is referenced to ground 29 for use in the hybrid circuit 32. This signal is presented on a line 90 to the feedback line 62 and also to a scaling circuit 92 to produce a motor current telemetry (TLM) signal at an output 94.

Figure 2:
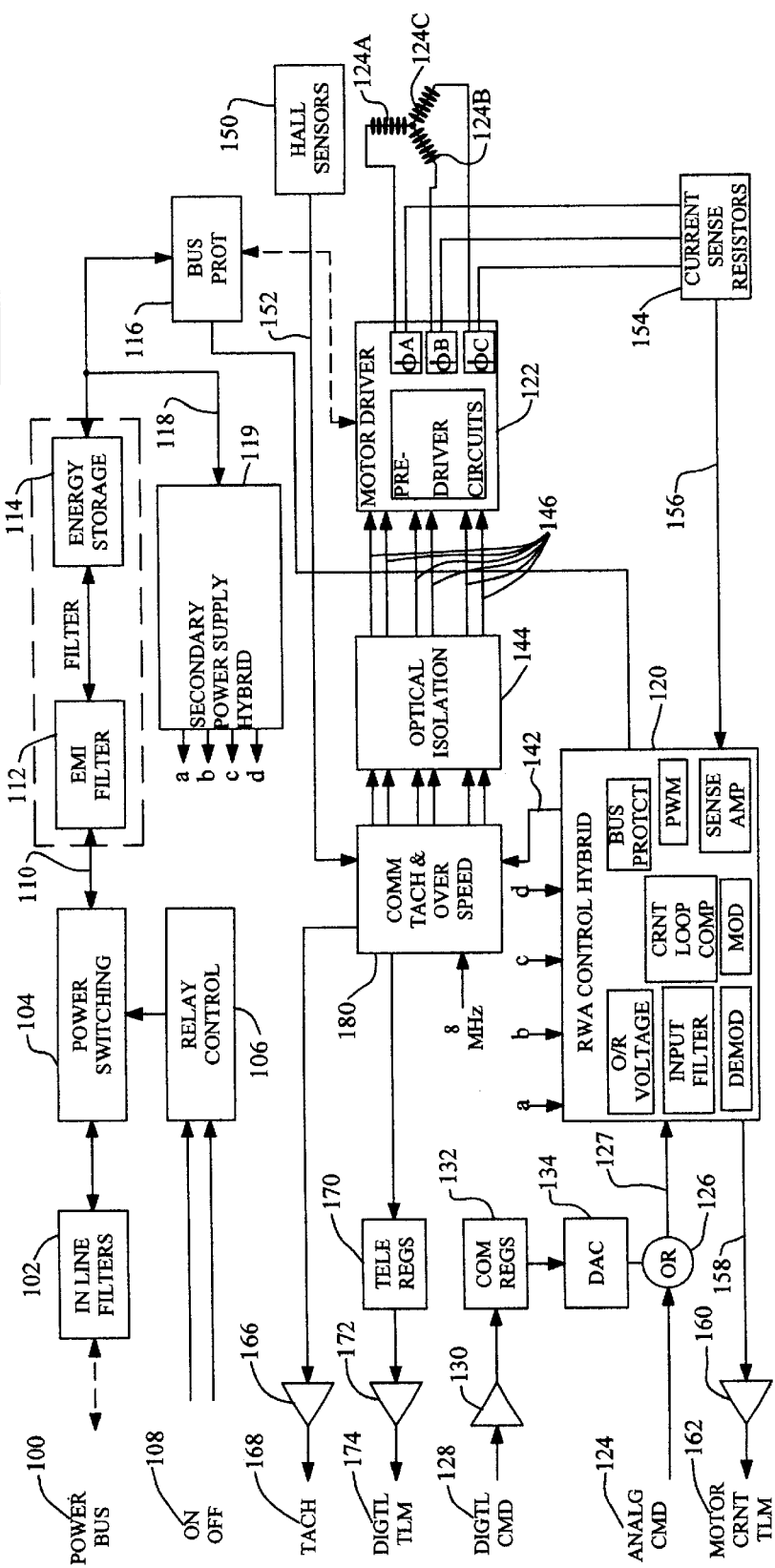
FIG. 2 shows a block diagram of the electronics of the motor controller.

FIG. 2 shows the electrical block diagram for the motor control circuit of the present invention. In FIG. 2, the power bus input 100 is shown passing through in-line filters 102 and a power switching circuit 104 which is turned on and off by a relay control 106 from an on/off input 108 (not shown in FIG. 1) and produces an output on a line 110 which is connected to an EMI filter 112. EMI filter 112 is connected to an energy storage circuit 114 and from there to a bus protection circuit 116 in a manner similar to the arrangement of FIG. 1. Line 115 is connected by a line 118 to a secondary power supply box 119 (not shown in FIG. 1) which provides various voltages shown by references a, b, c and d having ground references 21 or 29 as required for use with an RWA Control Hybrid circuit 120 and other equipment connected to the system. In the preferred embodiment, the a and b are +5 volts and the c and d voltages are ±12 volts. The RWA Control Hybrid circuit 120 contains the elements shown by functional block "O/R Voltage" (over/under voltage), "Input Filter", "Demod" (demodulator), "Mod" (modulator), "CRNT Loop Comp" (current loop compensation), "Bus Protct" (bus protection), "PWM" (pulse width modulation) and "Sense Amp" (sense amplifier). It will be noted that the "Bus Protection" circuit is shown both inside and outside of the hybrid box 120. The portion inside is a "Pre-drive" circuit while the portion outside identified with reference numeral 116 is the "Final Drive" circuit which is connected to a Motor Driver circuit 122.

An analog command 124 is shown in FIG. 2 connected to an OR function 126 and a digital torque command 128 is shown connected to circuitry shown as the "other" box of FIG. 1 and comprises an amplifier 130, a telemetry register 132 and a digital to analog converter 134 the output of which is also connected to OR function 126. OR function 126 selects one of the commands and presents it to the hybrid circuitry 120 via input 127.

The commutator 74 of FIG. 1 is shown in FIG. 2 as a commutation tachometer and overspeed box 180 which receives an output from the hybrid circuit 120 on a line 142, HALL position information from box 150 through line 152, and a clock signal input identified as 8 MHz. The output signals of the hybrid circuit 120 are, as explained above, electrical signals referenced to a ground 29. The Commutation tachometer and overspeed box 180 is therefore connected to an optical isolator 144 which converts the electrical signals to optical signals and then transfers them to electrical signals again but referenced to ground 21 to produce the outputs 146 leading to the motor driver 122.

Bus protect circuit 116 is connected to the motor driver circuit 122 which contains the pre-driver circuits and the three phase outputs for the motor winding 124A, 124B and 124C. respectively. Hall sensors shown as box 150 provide feedback to the commutator 180 over a line 152, not shown in FIG. 1.

The current in the windings 124A, 124B and 124C is sensed by current sensors shown as box 154 and are presented to a current sensing amplifier in hybrid circuit 120 over a line 156. These form part of the scaling function of box 87 of FIG. 1. An output of the modulator 88 and demodulator 89 of FIG. 2 is presented on a line 158 to an amplifier 160 and then to an output identified as Motor Current Telemetry 162 which provides as signal for telemetry which enables the operator to read the motor currents. In similar fashion, and output from the commutator, tachometer and overspeed circuit 180 is presented to an amplifier 166 and then to an output identified as tachometer 168 to enable the operator to monitor the motor speed. Finally, an output from the commutator, tachometer and overspeed circuit 180 is presented to a telemetry register 170 and to an buffer 172 to an output identified as Digital telemetry 174 to enable the operator to monitor the digital signals.

Figure 3:
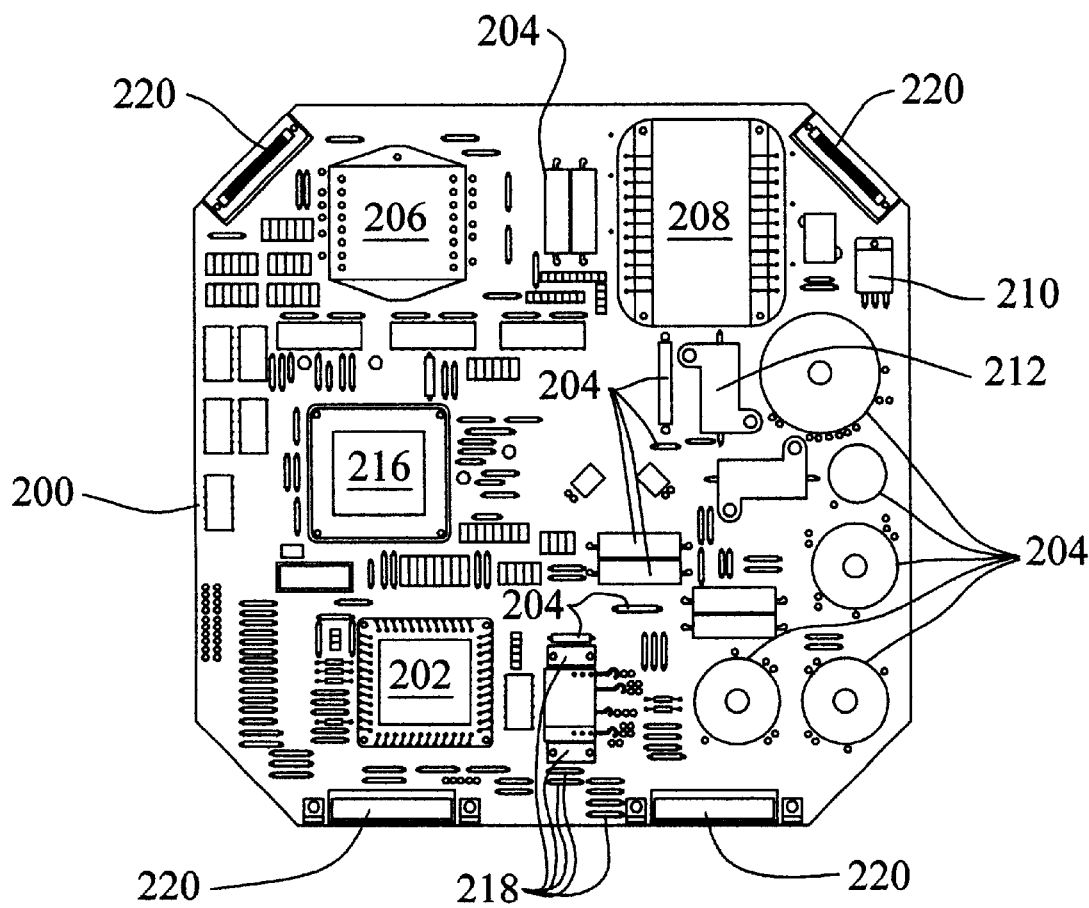
FIG. 3 shows the single circuit board electronics layout.

The elements of FIG. 2 have been assembled on a single circuit board having dimensions of approximately 10½ inches by 10½ inches in accordance with the present invention and this may be seen in FIG. 3. A circuit board 200 is shown containing the RWA Control Hybrid components 120 of FIG. 2 in a hybrid circuit 202 in FIG. 3. The in line filters 102 and the EMI filter 112 of FIG. 2, which have been improved from the prior art as described above, are shown as circles and boxes with reference numerals 204. The secondary power supply hybrid 122 of FIG. 2 is shown as hybrid circuitry 206 In FIG. 3. The motor driver circuit 122 of FIG. 2 is shown as circuitry 208 in FIG. 3. The hall sensors 150 of FIG. 2 are not shown in FIG. 3. The current sensing resistors 154 of FIG. 2 are shown as Z shaped boxes 212 in FIG. 3. The telemetry register 170, the command registers 132, the digital to analog converter 134 of FIG. 2 are shown as box 216 in FIG. 3. The relay controls 106 of FIG. 2 are shown as components 218 in FIG. 3.

Many other components, not shown in FIG. 2 including miscellaneous capacitors, resistors, amplifiers and the like are also shown on board 200 in FIG. 3 but have not been numbered so as to provide better clarity. Together they provide a single circuit board with all of the components necessary to provide the desired motor control in a minimum of space and cost. Board 200 is sized to fit within a space attached to the RWA by mounts to provide a neat and compact structure. User interface is provided through connectors 220.

It is therefore seen that we have provided a minimal cost, minimal size and high volume production device without compromising quality or performance. Further modifications of the preferred embodiment of the present invention my occur to those skilled in the art and we do not wish to be limited to the specific details used in describing the invention.

What is claimed is:

1. A compact motor driver circuit comprising:

a power bus;

an energy storage device connected to the power bus and operable to provide a first source of voltage referenced to a first ground, and provide a means of rejecting noise on the power bus through use of filtering;

a secondary power supply connected to the power bus and operable to provide a second source of voltage referenced to a second ground, a hybrid circuit referenced to the second ground connected to the second source of voltage, said hybrid circuit comprising an input to receive motor control commands, a combiner to combine a motor control command with a feedback signal containing wanted and extraneous signals if any, a compensator connected to receive the combined motor control signal and feedback signal and to remove extraneous signals to produce the desired motor control signal, and a pulse width modulator to receive the motor control signal and operable to produce an average voltage control signal;

a motor driver circuit connected to receive the average voltage control signal, said motor driver circuit including a first converter to change the average voltage signal from one referenced to the second ground to one referenced to the first ground and to produce a three phase control signal to be presented to a motor; the motor and motor driver circuit operable to produce a feedback signal containing any wanted and extraneous signals for use in the hybrid circuit, and a second converter connected to receive the feedback signal and to change the feedback signal from one referenced to the first ground to one referenced to the second ground for presentation to the combiner; and a single circuit board mounting the energy storage device, the hybrid circuit and the motor driver circuit.

2. Apparatus according to claim 1 further including a bus protection circuit connected between the energy storage device and the motor driver circuit to protect the power bus, at least a portion of the bus protection circuit being formed on the hybrid circuit.

3. Apparatus according to claim 1 wherein the three phase signals from the motor driver circuit are presented to a current sensing circuit to produce the feedback signals for the hybrid circuit.

4. Apparatus according to claim 1 further including a source of analog motor control signals and said hybrid circuit includes a selector to receive the analog motor control signals for presentation to the input to receive motor control commands.

5. Apparatus according to claim 4 further including a source of digital motor control signals and the selector operates to select one of the motor control signals for presentation to the input to receive motor control commands.

6. Apparatus according to claim 1 further including an EMI filter connected between the power bus and the multiplier.

7. Apparatus according to claim 6 further including a secondary power supply connected to the filtered power bus for supplying a plurality of other voltages.

8. Apparatus according to claim 1 wherein the first converter includes an optical isolation device for receiving the control signal, converting the control signal to an optical signal, transmitting the optical signal and converting the transmitted optical signal to an electrical control signal referenced to the first ground.

9. Apparatus according to claim 1 wherein the second converter includes a demodulator and a modulator to convert the feedback signal to electrical signals referenced to the second ground.

10. A single printed circuit board comprising;

a plurality of filters, at least one of which is connected to receive power from a power bus to produce a filtered power signal;

an energy storage circuit connected to the at least one filter to receive the filtered power signal;

a plurality of input circuits to receive motor command signals;

a selector circuit connected to the input circuits to receive the motor command signals and to produce a selected one;

a combiner circuit connected to receive the selected one and a feedback signal to produce a combined signal;

a compensator connected to receive the combined signal and to produce a desired signal;

an averager for receiving the desired signal and to produce a clean command signal;

a motor driver circuit connected to receive the clean command signal and to produce a three phase motor control signal therefrom; and a feedback connection from the motor driver circuit to the combiner circuit to supply the feedback signal thereto.

11. The single circuit board of claim 10 further including a plurality of inductors and capacitors to provide the plurality of filters.

12. The single circuit board of claim 10 wherein the modulator comprises a pulse width modulator.

13. The single circuit board of claim 10 further including a hybrid circuit in which the energy storage circuit, the selector circuit, the combiner, and the feedback connection are arranged.

14. The single circuit board of claim 10 where in the board is no larger than 10½ inches by 10½ inches.

15. A motor controller comprising: an input filter connected to receive at least one of a plurality of command torque signals and produce a filtered torque command signal therefrom;

a selector connected to receive the filtered torque command signal and to produce a selected filtered torque signal therefrom;

a combiner connected to receive the selected filtered torque signal and a feedback signal containing a plurality of feedback components and to produce a selected filtered error signal containing a plurality of feedback components;

a compensator connected to receive the selected filtered torque signal containing a plurality of feedback components and to produce a final torque current signal containing a signal for reacting to the feedback signal;

a pulse width modulator connected to receive the final torque current signal and produce a modulated voltage command signal;

a commutator connected to receive the modulated command signal and produce a resulting signal for energizing the proper winding of a motor connection means connecting said resulting signal to a motor driver to produce a final motor drive signal;

and means connecting the motor current signal to the combiner to supply the feedback components thereto.

* * * * *